United States Patent
Goldstein

(10) Patent No.: US 7,237,914 B2
(45) Date of Patent: Jul. 3, 2007

(54) LIGHT CONDENSER

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 427 days.

(21) Appl. No.: 10/713,842

(22) Filed: Nov. 14, 2003

(65) Prior Publication Data

US 2004/0169835 A1    Sep. 2, 2004

Related U.S. Application Data

(62) Division of application No. 10/206,779, filed on Jul. 25, 2002, now Pat. No. 6,801,298.

(51) Int. Cl.
  *G02B 5/10* (2006.01)
  *G03B 27/54* (2006.01)
(52) U.S. Cl. ......................................... 359/852; 355/67
(58) Field of Classification Search ................ 359/359, 359/851, 852, 853, 858; 355/67
  See application file for complete search history.

(56) References Cited

U.S. PATENT DOCUMENTS

| | | | | |
|---|---|---|---|---|
| 2,759,106 | A * | 8/1956 | Wolter | 378/43 |
| 4,475,027 | A * | 10/1984 | Pressley | 219/121.6 |
| 4,841,946 | A * | 6/1989 | Marks | 126/618 |
| 5,285,320 | A * | 2/1994 | Hohberg | 359/853 |
| 6,172,825 | B1 * | 1/2001 | Takahashi | 359/859 |
| 6,195,201 | B1 | 2/2001 | Koch et al. | |
| 6,231,198 | B1 * | 5/2001 | Foo | 359/855 |
| 6,452,661 | B1 | 9/2002 | Komatsuda | |
| 6,573,978 | B1 | 6/2003 | McGuire, Jr. | |
| 6,620,995 | B2 * | 9/2003 | Vasylyev et al. | 136/246 |
| 6,700,644 | B2 | 3/2004 | Sweatt | |

FOREIGN PATENT DOCUMENTS

JP          06-130301     * 5/1994

* cited by examiner

*Primary Examiner*—Alessandro Amari
(74) *Attorney, Agent, or Firm*—Fish & Richardson P.C.

(57) ABSTRACT

A light condenser suitable for EUV lithography that includes reflective rings concentric to an optical axis. Each ring has a reflective surface to reflect light rays emanating from a light source so that the light rays converge towards a mask to produce Köhler illumination on the mask. The reflective surface has a curve segment that includes a section of a parabolic curve that is rotated relative to an optical axis and has a focal point at the light source.

17 Claims, 7 Drawing Sheets

LIGHT CONDENSER

RELATED APPLICATIONS

This application is a divisional and claims priority to U.S. application Ser. No. 10/206,779, filed Jul. 25, 2002 now U.S. Pat. No. 6,801,298, the contents of which are incorporated herein by reference.

TECHNICAL FIELD

This description relates to light condensers.

BACKGROUND

Light condensers are used for example, in extreme ultraviolet (EUV) lithography systems. In EUV, an EUV light source illuminates a mask having a lithography pattern. The projection optics may take the form of a combination of mirrors used to project an image of the lithography pattern onto a substrate (e.g., a silicon wafer) coated with a layer of photo-resist. The lithography pattern is transferred to the substrate by developing the photo-resist and etching exposed portions of the substrate surface. Because EUV light has a very short wavelength, it can be used to generate patterns on the substrate with very small dimensions. An EUV light source may be a plasma generated by focusing a high-energy laser beam onto a stream of inert gas, such as Xenon, to produce ionized gas molecules. The plasma may also be generated by an electric arc. Light rays are emitted when the ionized gas molecules transition from higher energy states to lower energy states. Plasma sources typically have irregular brightness distributions. For good results in lithography, it is desirable for the light that reaches the substrate to be relatively uniform.

DETAILED DESCRIPTION

Figure 1:
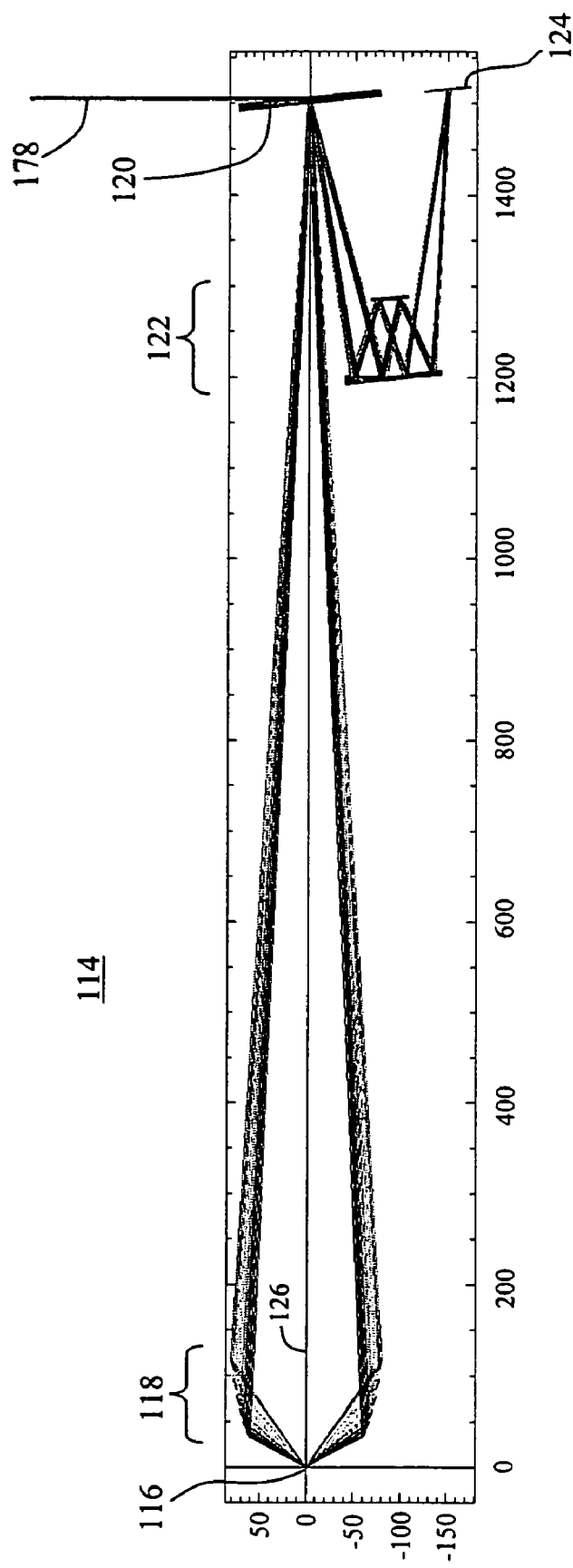
FIG. 1 shows an EUV lithography system with a Köhler forming light condenser.

By using a condenser having reflective surface curvatures that produce Köhler illumination, uniform illumination for use in a lithography process may be generated from a spatially unstable or non-uniform light source. Referring to FIG. 1, a lithography system 114 includes a plasma light source 116 that generates EUV light, a condenser 118 that collects and focuses the light onto a mask 120 having a circuit pattern, and projection optics 122 that focus an image of the circuit pattern onto a wafer 124 coated with a photo-resist. The image of the mask is then transferred to the wafer 124 using an etching process. Condenser 118 has reflective rings that are concentric to an optical axis 126 and configured to reflect light rays from light source 116 to generate a substantially uniformly illuminated area (e.g., 165 in FIG. 6) on the mask 120. It is useful to illuminate the area uniformly so that portions of the mask 120 that reflect light will produce uniformly illuminated regions on the photo-resist. This allows production of high-quality small-dimension circuit patterns on the wafer 124.

The numbers on the horizontal and vertical axes of FIGS. 1 and 3-5 represent distances in millimeters.

Each reflective ring in the condenser 118 produces an annular illumination with wave fronts of different rings converging to a circular region on the mask 120. This produces Köhler illumination on the mask so that irregularities in the brightness distribution of the light source do not cause irregularities in the intensity of the illumination at the mask 120. Köhler illumination refers to using a uniformly illuminated region (or an image of the uniformly illuminated region) to illuminate an object (e.g., the mask), rather than using an image of the light source to illuminate the object. By using Köhler Illuminating the mask 120 with a substantially uniform field of light results in a more accurate reproduction of the mask pattern on the surface of wafer 124.

A parameter called "partial coherence" is often used in the design of a lithography system. In the example of lithography system 114, partial coherence may be defined as the ratio of the numerical aperture of the light projected towards the mask 120 over the numerical aperture of the projection optics 122. By adjusting the design to alter the value of partial coherence, it is possible to optimize the depth of focus and exposure latitude so that the process window is tuned to a particular photo-resist to produce fine and sharp circuit patterns through a lithography process. An advantage of condenser 118 is that the different rings converge light onto the mask at different angles, so the reflective rings in condenser 118 provide light with a range of convergence angles. This allows the lithography system 114 to have a wider range of partial coherence values, providing more flexibility in the design of projection optics 122 and in the selection of photo-resists to achieve a higher resolution in the circuit patterns produced on the wafer 124.

Each reflective ring has a surface curvature such that the reflective ring is "non-imaging", i.e., light that is emitted from a point light source (within light source 116) and collected by each ring is converged to a field (e.g., 167 of FIG. 5) having a finite area (as compared to "imaging" optics that converge light to a single point). Therefore, non-uniformities in the light source 116 tend to average out and impose fewer undesirable effects on the image quality produced on wafer 124. When a single ring is used, the solid angle of light collection is related to the size of the field. To increase the solid angle of light collected by the ring, the field size has to be increased. By using multiple reflective rings, it is possible to increase light collection without increasing the area exposed to the light on the mask 124, thereby increasing the intensity of light illuminating the mask 120 and wafer 124.

A position control tool (not shown in the figure) may be used to control the relative positions of the condenser 118, mask 120, projection optics 122, and wafer 124 to align the various components and improve the image quality on the wafer 124.

In the following description of condenser 118, the light rays reflected from the condenser 118 are assumed to converge towards a plane 178 that is perpendicular to the optical axis 126. In operation, the mask 120 is positioned so that one surface of the mask having the circuit pattern is substantially aligned with the plane 178, but tilted at a small angle so that light reflected from the mask 120 may be reflected towards the projection optics 122.

Figure 2:
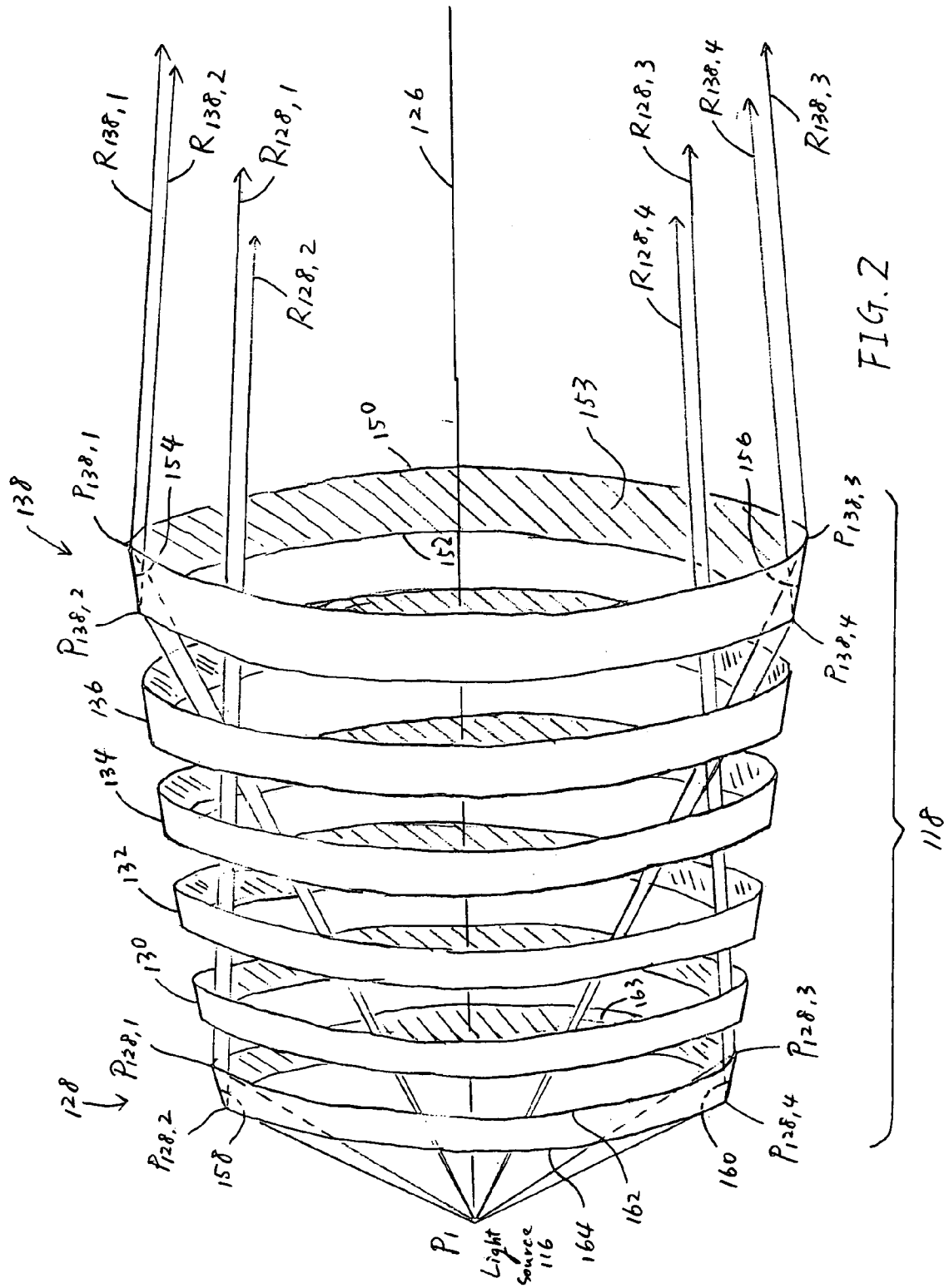
FIGS. 2 and 3 show a Köhler forming light condenser.
Figure 3:
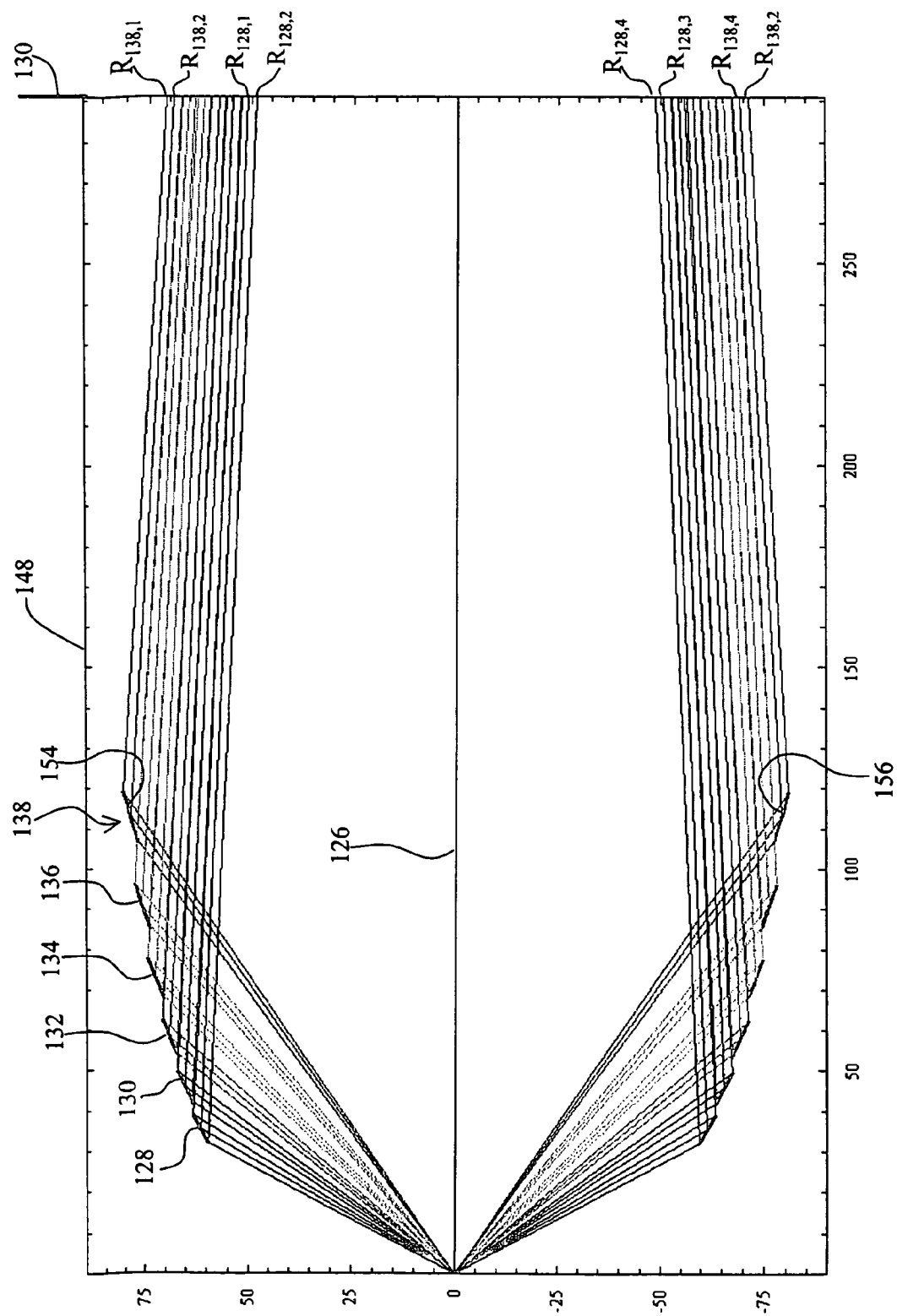

In FIGS. 2-5, notation $R_{x,y}$ will be used to refer to the y-th ray reflected by reflective ring x. For example, the first ray reflected by ring 138 is denoted $R_{138,1}$. Referring to FIGS. 2-5, condenser 118 includes reflective rings 128, 130, 132, 134, 136, and 138. FIG. 2 shows a perspective view of the condenser 118, and FIG. 3 shows a cross sectional view of the condenser 118 along a plane 148 parallel to the surface of the paper showing FIG. 3. Plane 148 passes through the optical axis 126. Ring 138 has an inner reflective surface 153 that includes portions 154 and 156 which are symmetric about the optical axis 126. Portion 154 reflects light rays (e.g., $R_{138,1}$ and $R_{138,2}$) emanating from a point $P_1$ into parallel light rays that project onto a region 164 (FIG. 4) on a plane 178 that is perpendicular to the optical axis 126. Portion 156 reflects light rays emanating from point $P_1$ into parallel light rays that also project onto region 164. Portions 154 and 156 are thin strips (see FIG. 3) on the inner reflective surface 153. Region 164 is a thin straight line. Portions 154 and 156 and region 164 lie on plane 148.

By sweeping portions 154 and 156 about the optical axis 126 in a three-dimensional space, while maintaining the same angle between the portions and the optical axis, the surface swept by the portions 154 and 156 forms the reflective surface 153. Reflective surface 153 comprises pairs of portions (similar to portions 154 and 156). Each portion of each of the pairs reflects light rays from point $P_1$ into parallel light rays that project onto a region on plane 178 that is similar to region 164. The light rays reflected from the two portions of a pair project onto the same region. Because reflective surface 153 may be viewed as being formed by sweeping portions 154 and 156 about the optical axis 126, light reflected from inner reflective surface 153 illuminates a circular region on plane 178 covered by rotating region 164 about the optical axis 126.

Ring 138 includes a distal edge 150 and a proximal edge 152, each having a circular shape. The term "proximal" means closer to the light source 116, and the term "distal" means farther from the light source 116. Plane 148 intersects the inner reflective surface 153 at portions 154 and 156. Portion 154 meets edges 150, 152 at points $P_{138,1}$ and $P_{138,2}$, respectively. Portion 156 meets edges 150, 152 at points $P_{138,3}$ and $P_{138,4}$, respectively. Points $P_{138,1}$ and $P_{138,3}$ are located at diametrically opposite positions on edge 150. Points $P_{138,2}$ and $P_{138,4}$ are located at diametrically opposite positions on edge 152.

Similar to ring 138, ring 128 has an inner reflective surface 163 that includes portions 158 and 160 which are symmetric about the optical axis 126. Portion 158 reflects light rays emanating from point $P_1$ into parallel light rays that project onto region 164 (see FIG. 4). Portion 160 reflects light rays emanating from point $P_1$ into parallel light rays that also project onto region 164. Portions 158 and 160 are thin strips on the inner reflective surface 163. Portions 158 and 160 and region 164 lie on plane 148 (which is parallel to the surface of the paper of FIG. 3).

By sweeping portions 158 and 160 about the optical axis 126, the surface swept by the portions 158 and 160 forms the reflective surface 163. Reflective surface 163 comprises pairs of portions (similar to portions 158 and 160), each portion of the pair reflects light rays from point $P_1$ into parallel light rays that project onto a region on plane 178. The light rays reflected from the two portions of a pair project onto the same region. Because inner reflective surface 163 is formed by sweeping portions 158 and 160 about the optical axis, the region on plane 178 illuminated by light reflected from inner reflective surface 163 is the circular region 167 formed by rotating region 164 about the optical axis 126.

Ring 128 has a distal edge 162 and a proximal edge 164. Plane 148 intersects the inner surface of ring 128 at portions 158 and 160. Portion 158 meets edges 162, 164 at points $P_{128,1}$ and $P_{128,2}$, respectively. Portion 160 meets edges 162, 164 at points $P_{128,3}$ and $P_{128,4}$, respectively. Points $P_{128,1}$ and $P_{128,3}$ are located at diametrically opposite positions on edge 162. Points $P_{128,2}$ and $P_{128,4}$ are located at diametrically opposite positions on edge 164.

Figure 4:
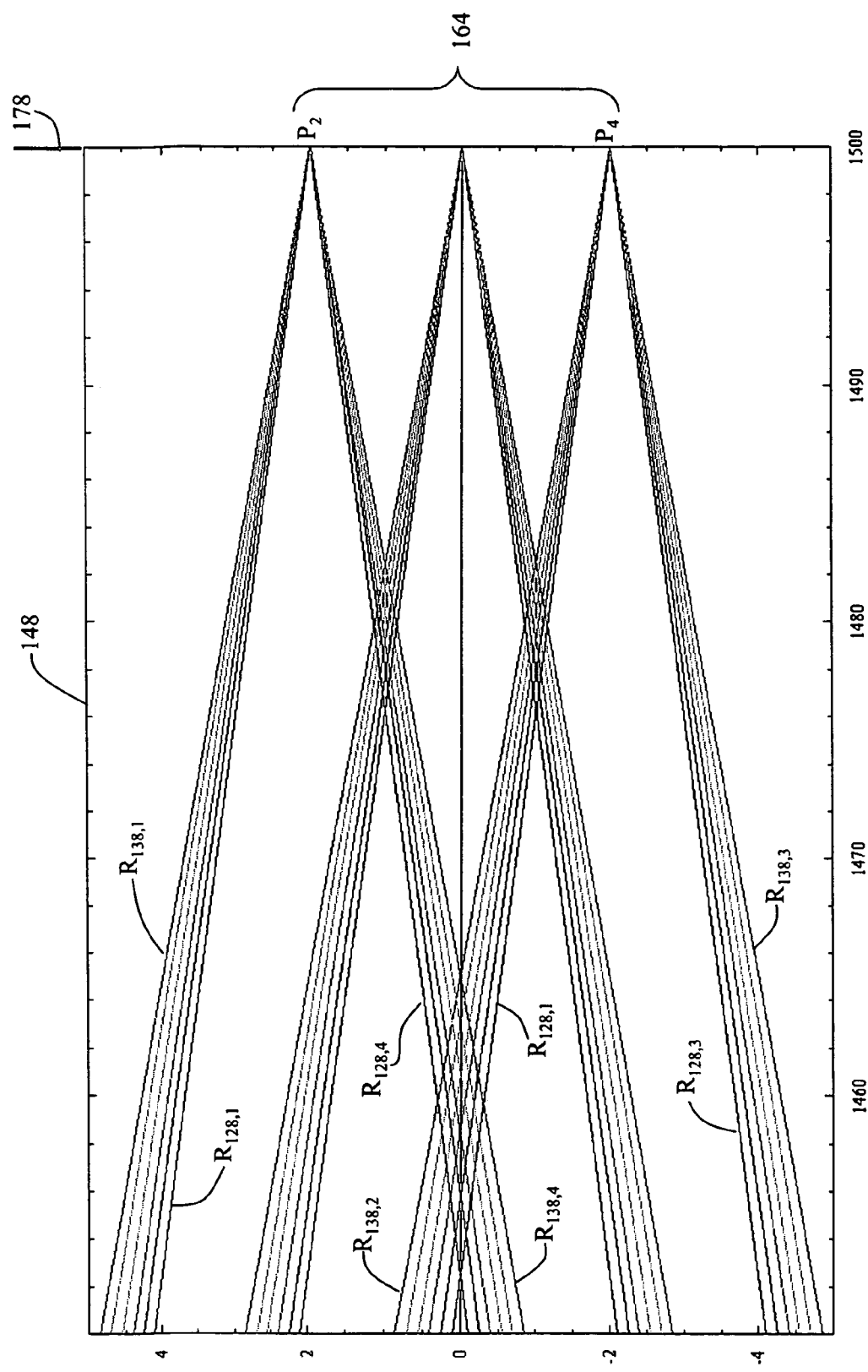
FIGS. 4-6 show ray tracing diagrams.

In FIG. 4, a light ray $R_{138,1}$ reflected from point $P_{138,1}$ (on ring 138) is projected onto a point $P_2$ on plane 178. A light ray $R_{138,2}$ reflected from point $P_{138,2}$ is projected onto a point $P_4$ on plane 178. A light ray $R_{138,3}$ reflected from point $P_{138,3}$ is projected onto point $P_4$, and a light ray $R_{138,4}$ reflected from point $P_{138,4}$ is projected onto point $P_2$. Points $P_2$ and $P_4$ are located at two ends of region 164.

Figure 5:
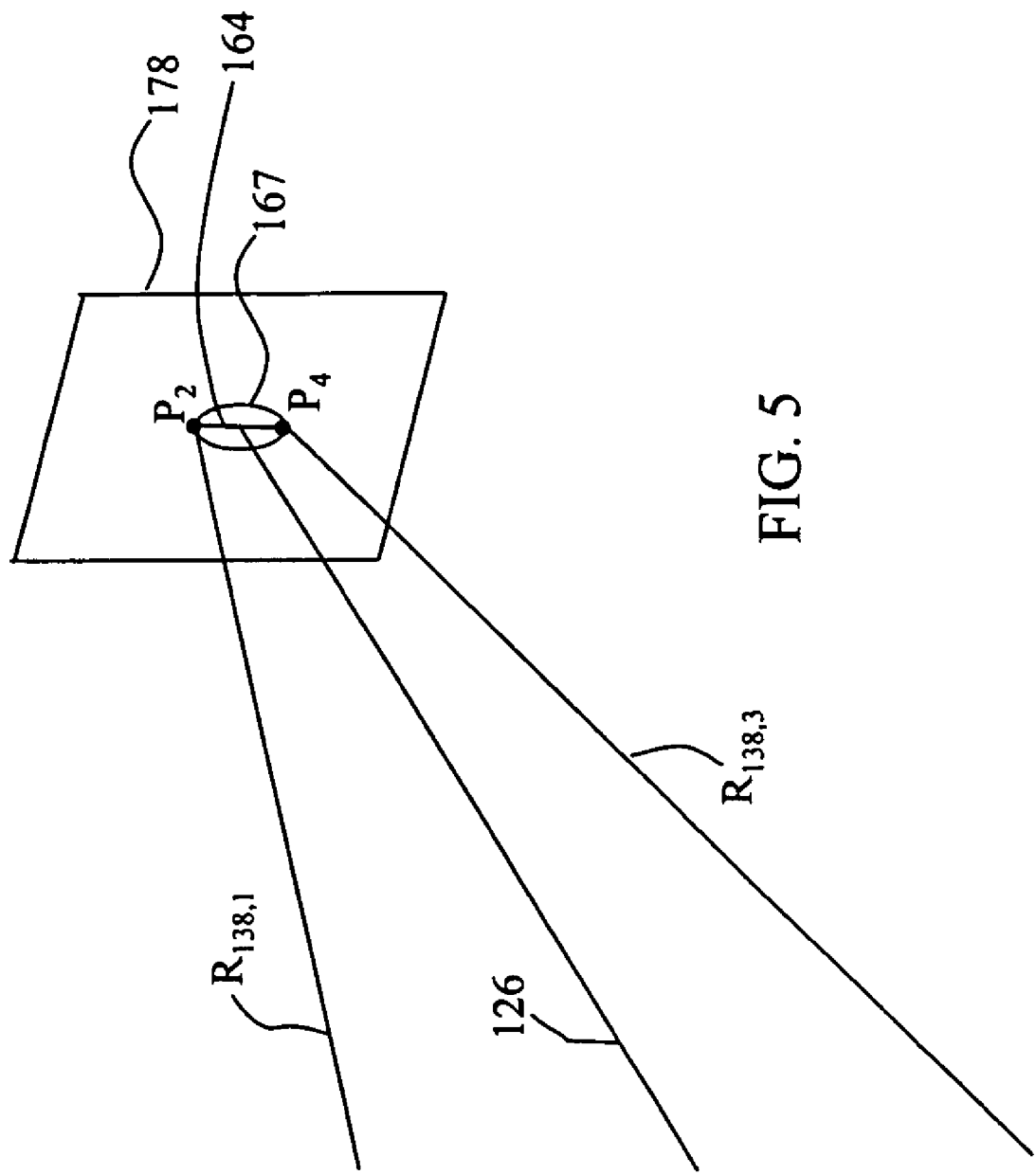

A light ray $R_{128,1}$ reflected from point $P_{128,1}$ on ring 128 is projected onto point $P_2$. A light ray $R_{128,2}$ reflected from point $P_{128,2}$ is projected onto point $P_4$. A light ray $R_{128,3}$ reflected from point $P_{128,3}$ is projected onto point $P_4$. A light ray $R_{128,4}$ reflected from point $P_{128,4}$ is projected onto point $P_2$. The reflective surfaces of rings 130, 132, 134, and 136 are designed to have properties similar to those of rings 128 and 138 so that the segments of the reflective surfaces intersected by plane 148 each reflects light rays from point $P_1$ into parallel lines that illuminate region 164. The reflective surfaces of rings 130, 132, 134, and 136 each reflect light from $P_1$ onto the circular region 167 (FIG. 5). By increasing the number of rings, the brightness or light intensity of the circular region 167 may be increased.

The reflective surfaces of rings 128, 130, 132, 134, 136, and 138 may be coated with a layer of ruthenium or other materials that enhance reflectivity of EUV light. The reflective surfaces may also have multilayer coatings suitable to reflect EUV light.

Figure 6:
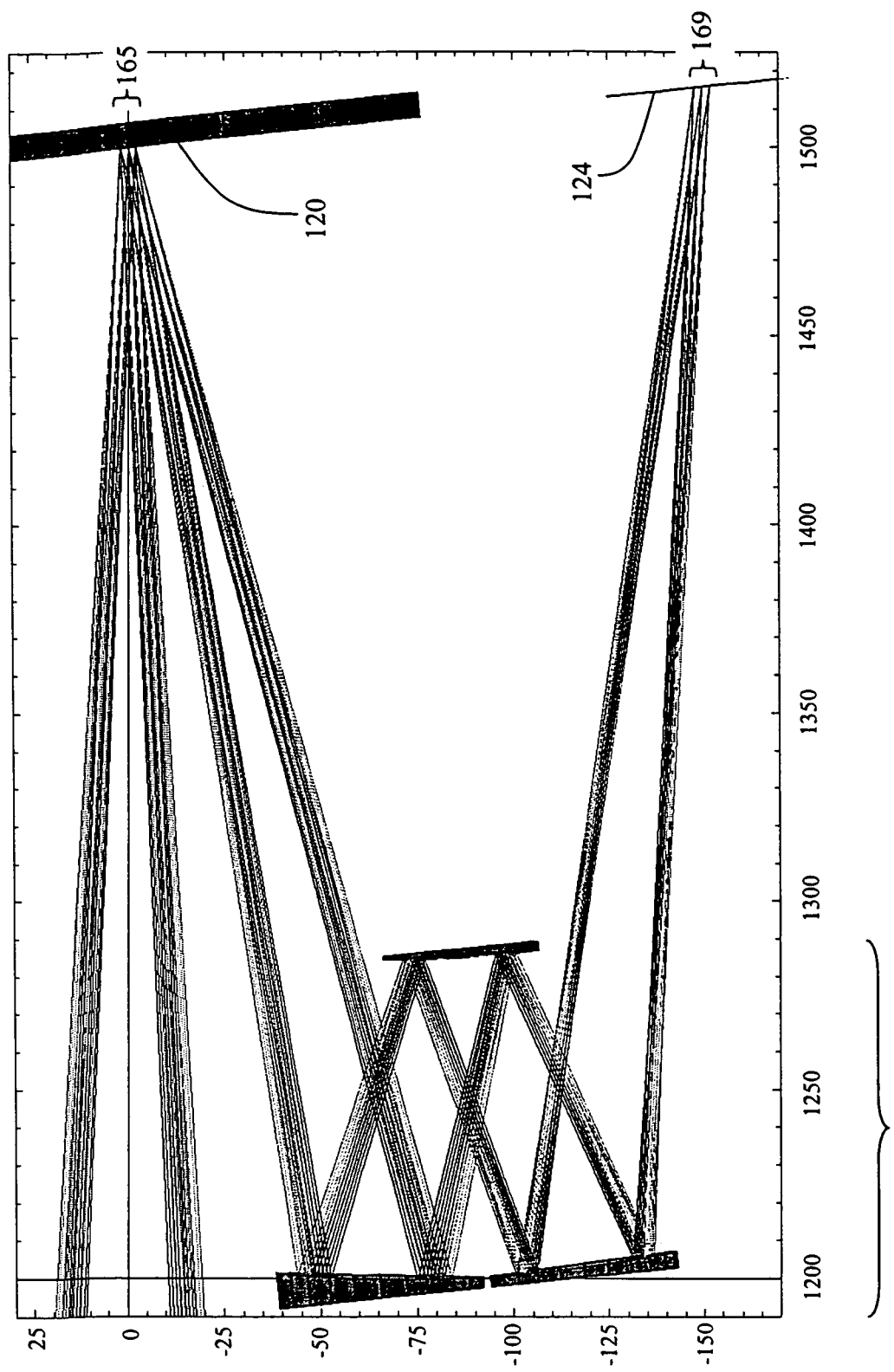

FIG. 6 shows a ray-tracing diagram of the mask 120, the projection optics 122, and the wafer 124. Light collected by the condenser 118 is converged onto a region 165 (that is substantially aligned with region 167) on the mask 120. Light reflected from region 165 is projected by projection optics 122 onto a region 169 on wafer 124. A stepper tool (not shown) may be used to move the mask 120 and the wafer 124 synchronously to expose different portions of the mask 120 so that the entire circuit pattern on the mask 120 may be transferred to the wafer 124.

Figure 7:
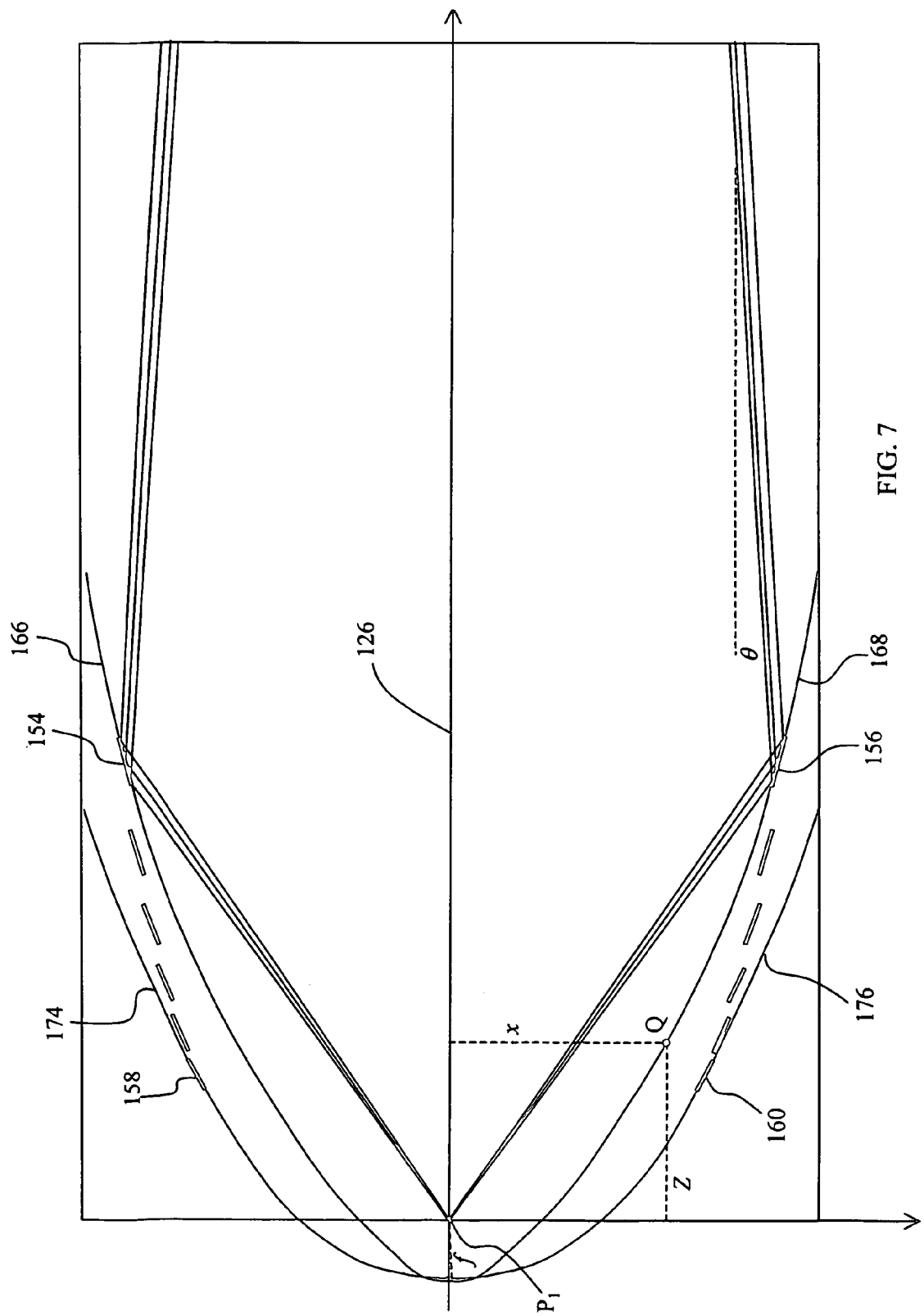
FIG. 7 shows Köhler forming curves.

Referring to FIG. 7, portion 156 on ring 138 is a segment of a "Köhler forming" curvature 168 that is formed by rotating a parabolic curve (with focal point at point $P_1$) on plane 148 counterclockwise (as viewed from a position above the paper of FIG. 7) about an axis 170 (not shown) that is perpendicular to plane 148 (which is parallel to the surface of the paper of FIG. 7) and passes through point $P_1$. The angle of rotation is equal to the convergence angle θ (the angle between the light propagation path and the optical axis 126). Because a parabolic curve reflects light from its focal point into rays parallel to its central axis, a segment on the rotated parabolic curve reflects light from point $P_1$ into parallel light rays that propagate at a convergence angle equal to the angle of rotation of the parabolic curve. Portion 154 is symmetric to segment 156 about the optical axis 126.

The curvature 168 may be designed using the equation $$Z[x, f, \theta] = -\frac{1}{4}\mathrm{Csc}^2[\theta]\mathrm{Sec}[\theta]\Big(-4f - 4f\,\mathrm{Cos}[2\theta] + x\,\mathrm{Sin}[\theta] + 8\sqrt{f}\,\sqrt{\mathrm{Cos}^2[\theta](f - x\,\mathrm{Sin}[\theta])} + x\,\mathrm{Sin}[3\theta]\Big), \quad \text{(Equ. 1)}$$

where θ is the convergence angle of the parallel light rays, f is the focal length of the parabolic curve used to generate the curvature 168, x is the distance between a point Q on the curvature and the optical axis 126, and Z is the distance between the point Q and a plane passing through point $P_1$ and perpendicular to the optical axis 126. The numerical aperture of the Köhler illumination is $\sin(\theta)$. The equation may also be expressed in open form as in a Taylor or other type of expansion of the equation. Approximate descriptions of the curvature expressed as truncated expansions of the equation may also be suitable to represent the shape of the curvature 168.

When angle $\theta \leq 90$ degrees, a Taylor expansion of Equ. 1 may be expressed as:

$$Z[x,f,\theta] = A_0 + A_1 X + A_2 X^2 + A_3 X^3 + A_4 X^4 + A_5 X^5 + A_6 X^6 + A_7 X^7 + A_8 X^8 + A_9 X^9 + A_{10} X^{10} +$$

where the coefficients may be expressed as:

$$A_0 = -f \operatorname{Sec}^2[\theta/2];$$

$$A_1 = \operatorname{Tan}[\theta/2];$$

$$A_2 = 1/(4f);$$

$$A_3 = \frac{\operatorname{Sin}[\theta]}{8 f^2};$$

$$A_4 = \frac{5 \operatorname{Sin}^2[\theta]}{64 f^3};$$

$$A_5 = \frac{7 \operatorname{Sin}^3[\theta]}{128 f^4};$$

$$A_6 = \frac{21 \operatorname{Sin}^4[\theta]}{512 f^5};$$

$$A_7 = \frac{33 \operatorname{Sin}^5[\theta]}{1024 f^6};$$

$$A_8 = \frac{429 \operatorname{Sin}^6[\theta]}{16384 f^7};$$

$$A_9 = \frac{715 \operatorname{Sin}^7[\theta]}{32768 f^8}; \text{ and}$$

$$A_{10} = \frac{2431 \operatorname{Sin}^8[\theta]}{131072 f^9}.$$

To design condenser 118, the reflective surface of ring 128 is first determined. This is achieved by choosing the desired convergence angle $\theta$ and focal length f This determines a Köhler Köhler forming curvature 176. A portion (i.e., 160) is then selected from the curvature 176. In selecting the portion, a consideration is the glazing angle of the light rays. The glazing angle is the angle between the incident light ray and the normal of the reflective surface. When EUV light is reflected by inner reflective surface (e.g., 153), the larger the glazing angle, the less damage caused to the reflective surface by the EUV light. The portion 160 is then swept about the optical axis 126. The surface swept by the portion 160 becomes the reflective surface 163.

Similarly, to design the reflective surface of ring 138, the desired convergence angle $\theta$ and focal length f are chosen, which determines a Köhler forming curvature 168. A portion (i.e., 156) is selected from the curvature 168. Portion 156 is swept about the optical axis 126. The surface swept by portion 156 becomes the reflective surface 153.

In designing the reflective surfaces for the rings 130, 132, 134, 136, and 138, the focal length of the Köhler forming curvature for each ring, as well as the positions of the portions on the curvature, are optimized so that a ring farther from the light source (located at $P_1$) does not block light rays reflected from rings closer to the light source. The focal length and the curve segments on the Köhler forming curvature are also selected in consideration of the overall size of the light condenser 118.

In operation, a plasma gas is generated at point $P_1$ to produce EUV light. Because the plasma gas has a finite volume, the plasma light source may be viewed as a collection of point light sources, with the locations of the point light sources changing within the finite volume over time. The condenser 118 projects light rays from a point light source slightly offset from point $P_1$ into a uniformly illuminated region similar to region 167 (FIG. 5) but with a slightly skewed shape and position. Each point light source that is offset from point $P_1$ produces a uniformly illuminated region with slightly different skewed shape and position (as compared to the circular shape of region 167). Collectively, the light rays from different point light sources are projected by the condenser 118 into uniformly illuminated regions that overlap to produce a substantially uniformly illuminated region 165 (FIG. 6). Region 165 is mostly uniformly illuminated except for the edges of the region. As the substantially uniformly illuminated region 165 is scanned across the mask 120, the irregularities at the edges of region 165 tend to have little effect in the overall lithography process. As a result, the irregularities in the brightness distribution of the plasma light source has little effect in the quality of the circuit patterns produced on the wafer 124.

The mask 120 is placed at a slight angle from plane 178 so that light reflected from the mask may be directed towards the projection optics 122. Placing the mask 120 at a slight angle from the plane 178 has little effect on the uniformity of brightness of light projected onto the patterns on the mask 120.

Although some implementations have been described above, other embodiments are also within the scope of the following claims.

For example, the lithography system 114 may be used with an entrance pupil and a secondary condenser. The entrance pupil filters out the edges of the illuminated circular region 167 where there may be some irregularities in the brightness of illumination. The mask 120 may be viewed as being illuminated by the image of the entrance pupil. Instead of using a reflective mask, a stencil mask that allows light to pass through certain regions may be used. When a stencil mask is used, the mask does not need to be tilted relative to the optical axis 126. Light sources other than a plasma light source may be used. The number of reflective rings may be varied. The width of the reflective rings may be varied. Rather than using rings, arcs that form segments of the rings may be used. The wafer 124 may be substituted with other types of substrates.

What is claimed is:

1. An apparatus comprising:
   a first reflective surface to reflect light rays emanating from a point, the first reflective surface having a curvature such that substantially all of the reflected light rays propagate at a first angle relative to an axis that passes through the point and converge towards a region to produce uniform illumination at the region.

2. The apparatus of claim 1 in which the reflective surface comprises a ruthenium layer.

3. The apparatus of claim 1 in which the reflective surface comprises multilayer coatings.

4. The apparatus of claim 1 further comprising a second reflective surface to reflect light rays emanating from the point, the second reflective surface having a curvature such that the reflected light rays propagate at a second angle with the optical axis, the reflected light rays forming an annular wave front that converges towards the region.

5. The apparatus of claim 4 in which the second angle is different from the first angle.

6. An apparatus comprising:
a reflective surface positioned relative to an optical axis to reflect light rays emanating from a location on the optical axis so that the light rays converge towards a region on a plane perpendicular to the optical axis, the reflective surface having a curve segment that comprises a section of a parabolic curve that has a focal point at the location and has been rotated through an angle relative to the optical axis about an axis of rotation that is non-parallel to the optical axis.

7. The apparatus of claim 6 in which the reflective surface comprises the surface swept by sweeping the curve segment about the optical axis.

8. The apparatus of claim 6 in which the rotation angle of the parabolic curve equals the angle between the optical axis and a propagation direction of light rays reflected by the reflective surface.

9. The apparatus of claim 6 in which the rotated parabolic curve may be represented by an equation $$Z[x, f, \theta] = -\frac{1}{4}\mathrm{Csc}^2[\theta]\mathrm{Sec}[\theta]\left(-4f - 4f\mathrm{Cos}[2\theta] + x\mathrm{Sin}[\theta] + 8\sqrt{f}\sqrt{\mathrm{Cos}^2[\theta](f - x\mathrm{Sin}[\theta])} + x\mathrm{Sin}[3\theta]\right),$$

where Z is the distance between a point on the curve and a plane passing through the location and perpendicular to the optical axis, x is the distance from the point to the optical axis, θ is the angle of rotation of the parabolic curve, and f is the focal length of the parabolic curve.

10. The apparatus of claim 6 in which the rotated parabolic curve may be approximated by a truncated expansion of an equation $$Z[x, f, \theta] = -\frac{1}{4}\mathrm{Csc}^2[\theta]\mathrm{Sec}[\theta]\left(-4f - 4f\mathrm{Cos}[2\theta] + x\mathrm{Sin}[\theta] + 8\sqrt{f}\sqrt{\mathrm{Cos}^2[\theta](f - x\mathrm{Sin}[\theta])} + x\mathrm{Sin}[3\theta]\right),$$

where Z is the distance between a point on the curve and a plane passing through the location and perpendicular to the optical axis, x is the distance from the point to the optical axis, θ is the angle of rotation of the parabolic curve, and f is the focal length of the parabolic curve.

11. A method comprising:
generating light rays from a location on an optical axis;
reflecting the light rays with a first reflective surface having a curvature such that substantially all of the reflected light rays propagate with a first convergence angle relative to the optical axis, the light rays converging toward a region to produce uniform illumination at the region.

12. The method of claim 11 further comprising reflecting the light rays with a second reflective surface having a curvature such that substantially all of the light rays reflected from the second reflective surface propagate with a second convergence angle relative to the optical axis, the light rays converging toward the region.

13. The method of claim 12 in which the second angle is different from the first angle.

14. A method comprising:
providing a first reflective surface to reflect light rays emanating from a location, the first reflective surface having a curvature such that substantially all of the light rays reflected from the first reflective surface propagate in a direction at a first angle with an axis and converge toward a region to produce uniform illumination at the region; and
providing a second reflective surface to reflect light rays emanating from the location, the second reflective surface having a curvature such that substantially all of the light rays reflected from the second reflective surface propagate in a direction at a second angle with the axis and converge toward the region, the second angle different from the first angle.

15. The method of claim 14 in which the first reflective surface and the second reflective surface are concentric to the axis and the first reflective surface is closer to the location than the second reflective surface.

16. The method of claim 14 further comprising adjusting the relative positions of the first and second reflective surfaces so that when light rays are reflected by the first reflective surface, the reflected light rays are not blocked by the second reflective surface.

17. The method of claim 16 further comprising treating the surface of the first and second reflective surfaces to enhance reflectivity of light having wavelength less than 300 nm.

* * * * *